(12) United States Patent
Lin et al.

(10) Patent No.: US 6,459,613 B1
(45) Date of Patent: Oct. 1, 2002

(54) CURRENT-MODE IDENTIFYING CIRCUIT FOR MULTILEVEL FLASH MEMORIES

(75) Inventors: Hongchin Lin, Taipei; Chein-Zhi Chen, Chiayi Hsien; Shyh-Chyi Wong, Taichung, all of (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/984,285

(22) Filed: Oct. 29, 2001

(51) Int. Cl.[7] ............. G11C 16/04; G11C 16/06

(52) U.S. Cl. ............. 365/185.03; 365/185.2; 365/185.21; 365/185.33

(58) Field of Search ............. 365/185.03, 185.17, 365/185.2, 185.21, 185.33

(56) References Cited

U.S. PATENT DOCUMENTS

| | | | | |
|---|---|---|---|---|
| 5,894,436 A | * | 4/1999 | Ohkawa et al. | 365/185.03 |
| 6,209,113 B1 | * | 3/2001 | Roohparvar | 365/185.03 |
| 6,282,120 B1 | * | 8/2001 | Cernea et al. | 365/185.21 |

OTHER PUBLICATIONS

Cristiano Calligraro et al., "A High–Speed Parallel Sensing Scheme for Multi–Level Non–Volative' Memories," Proceedings of the International Workshop on Memory Technology, Design & Testing, 1997, pp. 96–101.

Donato Montanari et al., "Novel Level–Identifying Circuit for Flash Multilevel memories," IEEE, Journal of Solid–State Circuits, vol. 33, No. 7, 1998, pp. 1090–1095.

* cited by examiner

*Primary Examiner*—Trong Phan
(74) *Attorney, Agent, or Firm*—Morgan, Lewis & Bockius LLP

(57) ABSTRACT

A current-mode identifying circuit includes a current duplicating circuit for duplicating a cell current, which flows through a selected flash cell in a multilevel flash memory, and for outputting multiple duplicate cell currents. Each of multiple reference current generating units draws a predetermined reference current from a respective duplicate cell current to form a difference current. Each of multiple current comparators receives the difference current from a corresponding reference current generating unit, and outputs a logic signal corresponding to magnitude of the difference current. An encoder encodes the logic signals from the current comparators to identify a level associated with the cell current.

14 Claims, 4 Drawing Sheets

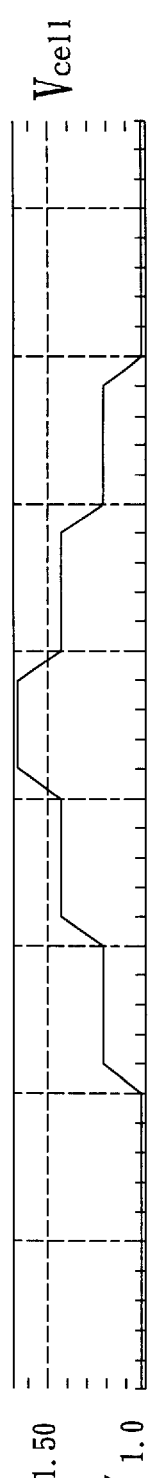
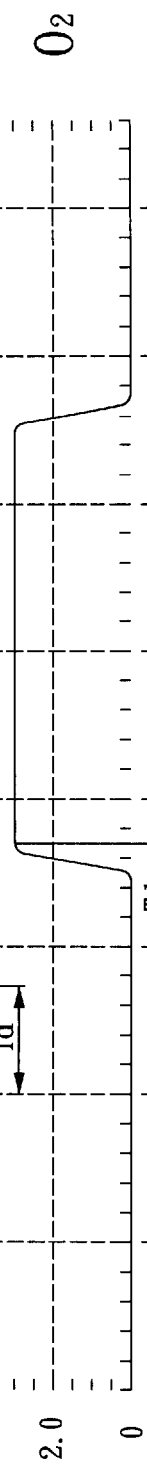
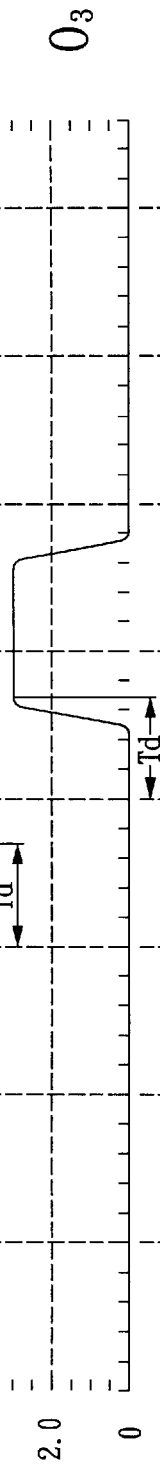
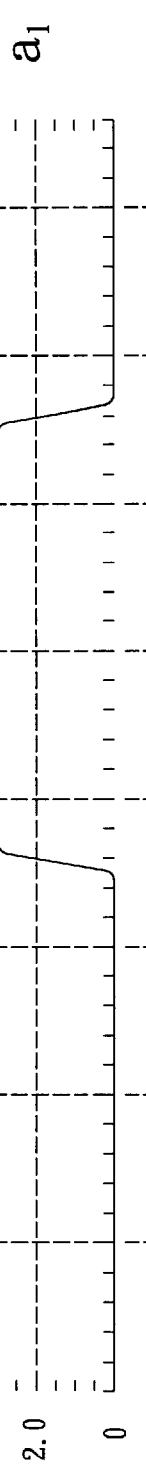
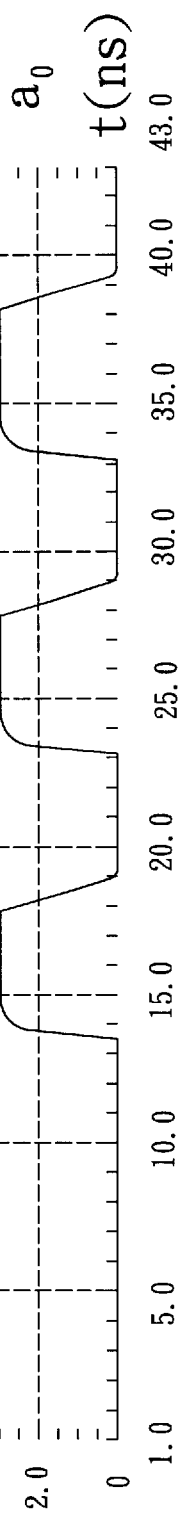
FIG. 5a
FIG. 5b
FIG. 5c
FIG. 5d
FIG. 5e
FIG. 5f

CURRENT-MODE IDENTIFYING CIRCUIT FOR MULTILEVEL FLASH MEMORIES

BACKGROUND OF THE INVENTION

1. Field of the Invention

The invention relates to a current-mode identifying circuit, more particularly to a current-mode identifying circuit for multilevel flash memories.

2. Description of the Related Art

In conventional semiconductor memory devices, by precharging the floating gate of a memory cell of a EEPROM, desired data can be written into the memory cell. However, the storage density of the conventional EEPROM is not high enough if only one-bit data can be stored per cell. Recently, multilevel flash memories for enhancing the storage density of electrically alterable nonvolatile memories have been proposed so as to store more than one-bit data per cell. For storing n-bit data per cell, a floating gate of a flash cell must be capable of being charged tom (m=$2^n$) levels. Sensing time and sensing result are important design considerations for a multilevel flash memory.

A conventional parallel current-mode multilevel identifying circuit for a multilevel flash memory has been proposed heretofore in an article by C. Calligaro and others, entitled "High-speed Parallel Sensing Scheme for Multilevel Nonvolatile Memories", Proc. Int. Workshop on Memory Technology, Design and Testing, pp. 96–101, 1997. The circuit includes a conventional current comparator composed of a differential amplifier circuit that may result in a voltage drift during amplifying. A correcting circuit is thus necessary to correct the voltage drift, thereby resulting in a complicated construction such that the conventional multilevel identifying circuit has a larger chip size and higher production costs. Furthermore, due to the use of the differential amplifier circuit, pre-charging is needed, and power consumption is thus increased.

Another conventional parallel current-mode identifying circuit for a multilevel flash memory has been proposed in an article by D. Montanari, J. V. Houdt and G. Groeseneken, entitled "Novel Level-Identifying Circuit for Flash Multilevel Memories", IEEE J. of Solid-State Circuits, vol. 33, no. 7, pp. 1090–1095, 1998. The circuit includes a conventional current comparator that utilizes a "winner-take-all" discriminator to identify a current level of a flash cell. Although the conventional current comparator with the discriminator has a simpler construction as compared with one using a differential amplifier circuit, it introduces a delay time equal to about 9 ns, thereby resulting in a relatively slow sensing speed.

SUMMARY OF THE INVENTION

Therefore, the object of the present invention is to provide a current-mode identifying circuit for a multilevel flash memory that can enhance data-sensing speed of the flash memory, that has a relatively small size and that can be fabricated at a relatively low cost.

According to the present invention, a current-mode identifying circuit is adapted for use with a multilevel flash memory having a flash cell array that includes a plurality of flash cells. The identifying circuit is adapted to identify a level associated with a cell current flowing through a selected one of the flash cells, and comprises:

a current duplicating circuit having an input adapted to be coupled electrically to the selected one of the flash cells, and a plurality of outputs, the current duplicating circuit duplicating the cell current flowing through the selected one of the flash cells, and outputting a duplicate cell current at each of the outputs;

a plurality of nodes, each of which is coupled electrically to a corresponding one of the outputs of the current duplicating circuit so as to receive the duplicate cell current therefrom;

a plurality of reference current generating units, each of which is coupled electrically to a corresponding one of the nodes and draws a predetermined reference current from the corresponding one of the nodes such that a difference current between the duplicate cell current and the predetermined reference current flows out from the corresponding one of the nodes;

a plurality of current comparators, each of which has an input end coupled electrically to a corresponding one of the nodes for receiving the difference current therefrom, and an output end for outputting a logic signal corresponding to magnitude of the difference current received thereby; and an encoder coupled electrically to the output ends of the current comparators for receiving the logic signals therefrom, the encoder encoding the logic signals so as to identify the level associated with the cell current flowing through the selected one of the flash cells.

BRIEF DESCRIPTION OF THE DRAWINGS

Other features and advantages of the present invention will become apparent in the following detailed description of the preferred embodiment with reference t accompanying drawings, of which:

FIGS. 5a to 5f are the simulated waveforms with different cell currents, which are achieved using different cell voltage $V_{cell}$ the first logic signal $O_1$, the second logic signal $O_2$, the third logic signal $O_3$, a first encoded signal $a_0$, and a second encoded signal $a_1$.

DETAILED DESCRIPTION OF THE PREFERRED EMBODIMENT

Figure 1:
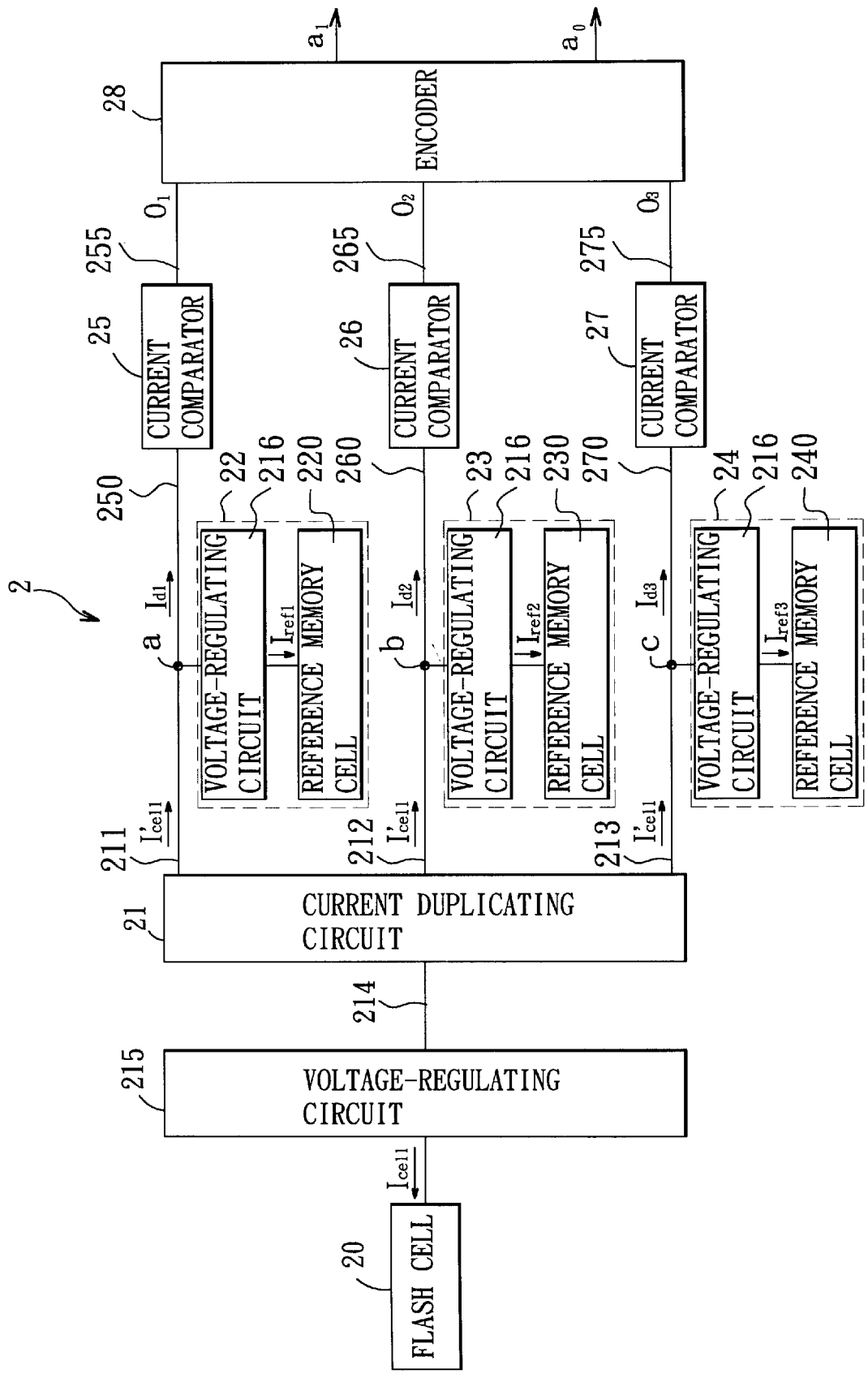
FIG. 1 a schematic circuit block diagram illustrating the preferred embodiment of a current-mode identifying circuit according to the present invention.
Figure 2:
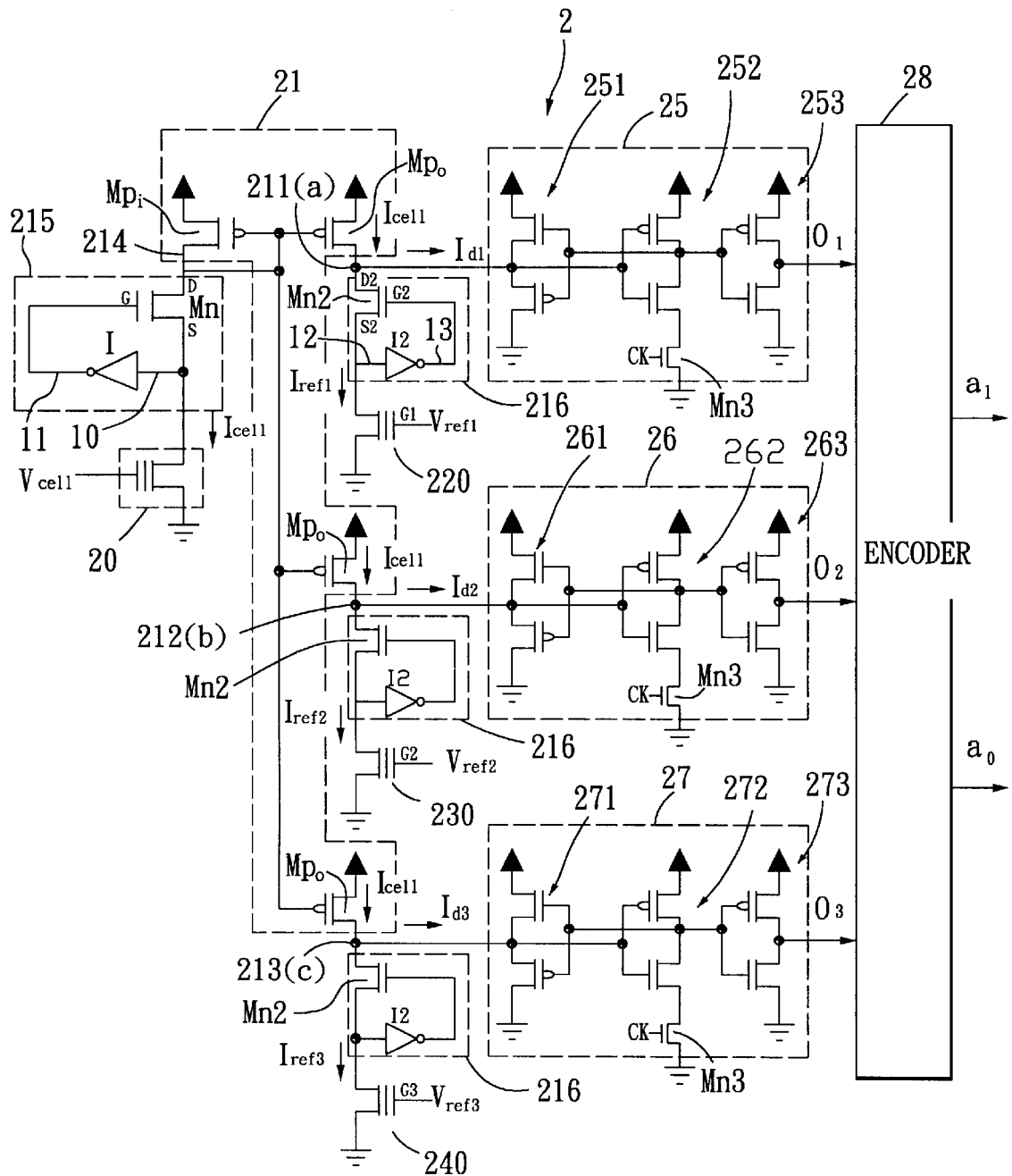
FIG. 2 is a schematic electrical circuit diagram illustrating the preferred embodiment.

Referring to FIGS. 1 and 2, according to the preferred embodiment of the present invention, a current-mode identifying circuit 2 is adapted for use with a multilevel flash memory having a flash cell array (not shown) that includes a plurality of flash cells. In this embodiment, the present invention is applied to a four-level flash memory. The current-mode identifying circuit 2 is adapted to identify a level associated with a cell current ($I_{cell}$) flowing through a selected flash cell 20 having data to be read, and includes a current duplicating circuit 21, a plurality of nodes (a, b, c), a plurality of reference current generating units 22, 23, 24, a plurality of current comparators 25, 26, 27, and an encoder 28.

The current duplicating circuit 21 has an input 214 adapted to be coupled electrically to the selected flash cell 20, and first, second and third outputs 211, 212, 213. The current duplicating circuit 21 duplicates the cell current ($I_{cell}$) flowing through the selected flash cell 20, and outputs a duplicate cell current ($I'_{cell}$) at each of the first, second and third outputs 211, 212, 213. In this embodiment, the current duplicating circuit 21 includes a PMOS current mirror that has a PMOS transistor ($Mp_i$) serving as the input 214, and three PMOS transistors ($Mp_o$) coupled electrically to the PMOS transistor ($Mp_i$) and serving as the first, second and third outputs 211, 212, 213, as shown in FIG. 2.

A voltage-regulating circuit 215 is adapted to be coupled electrically to the selected flash cell 20, and is coupled electrically to the input 214 of the current duplicating circuit 21 for stabilizing the cell current ($I_{cell}$) flowing through the selected flash cell 20. The voltage-regulating circuit 215 includes an NMOS transistor (Mn) having a drain (D) coupled electrically to the input 214 of the current duplicating circuit 21, a gate (G), and a source (S) adapted to be coupled electrically to the selected flash cell 20. The circuit 215 further includes an inverter (I) having an input port 10 coupled electrically to the source (S) of the NMOS transistor (Mn) and adapted to be coupled electrically to the selected flash cell 20, and an output port 11 coupled electrically to the gate (G) of the NMOS transistor (Mn).

The nodes (a, b, c) are coupled electrically to the first, second and third outputs 211, 212, 213 of the current duplicating circuit 21, respectively, so as to receive the duplicate cell current ($I'_{cell}$) therefrom.

The reference current generating units 22, 23, 24 are coupled electrically to the nodes (a, b, c), respectively. The reference current generating unit 22 draws a predetermined reference current ($I_{ref1}$) from the node (a) such that a difference current ($I_{d1}$) between the duplicate cell current ($I'_{cell}$) and the predetermined reference current ($I_{ref1}$) flows out from the node (a). The reference current generating unit 23 draws a predetermined reference current ($I_{ref2}$) from the node (b) such that a difference current ($I_{d2}$) between the duplicate cell current ($I'_{cell}$) and the predetermined reference current ($I_{ref2}$) flows out from the node (b) . The reference current generating unit 24 draws a predetermined reference current ($I_{ref3}$) from the node (c) such that a difference current ($I_{d3}$) between the duplicate cell current ($I'_{cell}$) and the predetermined reference current ($I_{ref3}$) flows out from the node (c) . In this embodiment, the reference current generating unit 22 includes a voltage-regulating circuit 216 coupled electrically to the node (a) for stabilizing the predetermined reference current ($I_{ref1}$) , and a reference memory cell 220 coupled electrically to the voltage-regulating circuit 216. The reference current generating unit 23 includes a voltage-regulating circuit 216 coupled electrically to the node (b) for stabilizing the predetermined reference current ($I_{ref2}$) , and a reference memory cell 230 coupled electrically to the voltage-regulating circuit 216. The reference current generating unit 24 includes a voltage-regulating circuit 216 coupled electrically to the node (c) for stabilizing the predetermined reference current ($I_{ref3}$), and a reference memory cell 240 coupled electrically to the voltage-regulating circuit 216. The reference memory cells 220, 230, 240 are controlled by specific reference voltages ($V_{ref1}$, $V_{ref2}$, $V_{ref3}$) , respectively, so as to control the amounts of the predetermined reference currents ($I_{ref1}$, $I_{ref2}$, $I_{ref3}$) drawn thereby. In this embodiment, each of the reference voltages ($V_{ref1}$, $V_{ref2}$, $V_{ref3}$) is different from the others. Alternatively, when the reference voltages ($V_{ref1}$, $V_{ref2}$, $V_{ref3}$) are kept equal to the others, the reference memory cells 220, 230, 240 can have pre-charged floating gates (G1, G2, G3), respectively, to control the amounts of the predetermined reference currents ($V_{ref1}$, $V_{ref2}$, $V_{ref3}$) drawn thereby. Each of the voltage-regulating circuits 216 includes an NMOS transistor (Mn2) having a drain (D2) coupled electrically to a corresponding one of the nodes (a, b, c), a gate (G2), and a source (S2) coupled electrically to a corresponding one of the reference memory cells 220, 230, 240. Each of the voltage-regulating circuits 216 further includes an inverter (I2) having an input port 12 coupled electrically to the source (S2) of the NMOS transistor (Mn2) and the corresponding one of the reference memory cells 220, 230, 240, and an output port 13 coupled electrically to the gate (G2) of the NMOS transistor (Mn2), as shown in FIG. 2.

Figure 3:
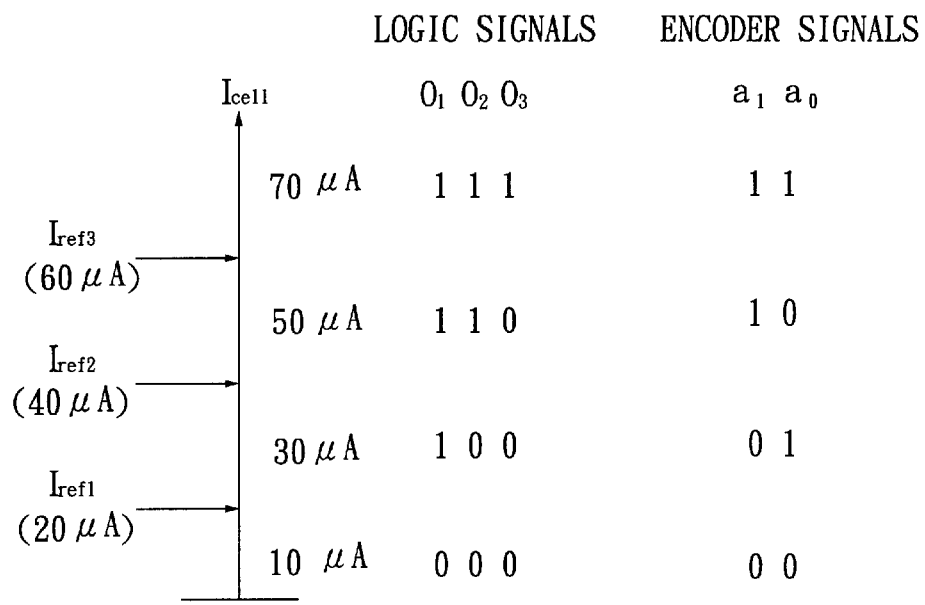
FIG. 3 is a truth table illustrating how an encoder of the preferred embodiment encodes first, second and third logic signals $O_1$, $O_2$, $O_3$ so as to identify different levels associated with different cell currents.

For example, referring to FIGS. 2 and 3, when the selected flash cell 20 is controlled by a cell voltage ($V_{cell}$) such that four-level cell currents ($I_{cell}$), such as 10 μA, 30 μA, 50 μA and 70 μA, can be generated, the predetermined reference currents ($I_{ref1}$, $I_{ref2}$, $I_{ref3}$) can be equal to 20 μA, 40 μA and 60 μA to permit a current variance of 10 μA for sensing accuracy. According to the present invention, the four-level cell currents ($I_{cell}$) of 10 μA, 30 μA, 50 μA and 70 μA can be represented by two-bit binary data, such as "00", "01", "10" and "11", respectively.

Figure 4:
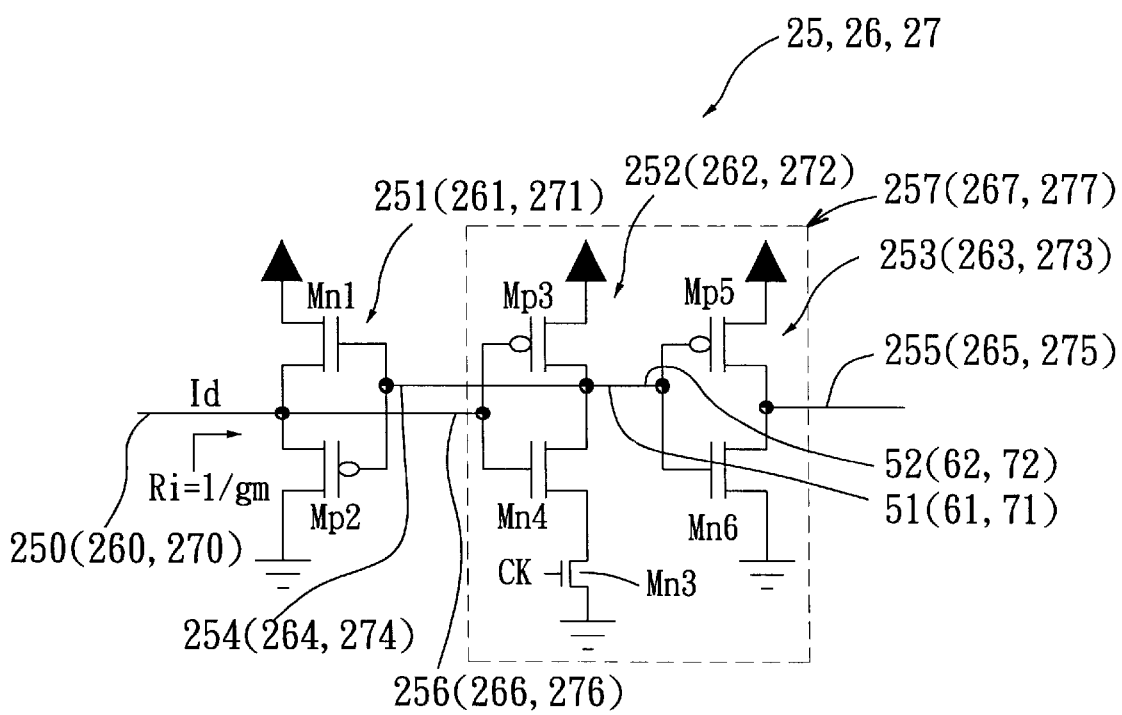
FIG. 4 is a schematic electrical circuit diagram illustrating a current comparator of the preferred embodiment.

The current comparator 25 has an input end 250 coupled electrically to the node (a) for receiving the difference current ($I_{d1}$), which may be positive for the duplicate cell current ($I'_{cell}$) larger than the predetermined reference current ($I_{ref1}$) or negative for the duplicate cell current ($I'_{cell}$) smaller than the predetermined reference current ($I_{ref1}$) therefrom, and an output end 255 for outputting a first logic signal ($O_1$) corresponding to magnitude of the difference current ($I_{d1}$) received thereby. The current comparator 26 has an input end 260 coupled electrically to the node (b) for receiving the difference current ($I_{d2}$) which may be positive for the duplicate cell current ($I'_{cell}$) larger than the predetermined reference current ($I_{ref2}$) or negative for the duplicate cell current ($I'_{cell}$) smaller than the predetermined reference current ($I_{ref2}$) therefrom, and an output end 265 for outputting a second logic signal ($O_2$) corresponding to magnitude of the difference current ($I_{d2}$) received thereby. The current comparator 27 has an input end 270 coupled electrically to the node (c) for receiving the difference current ($I_{d3}$), which may be positive for the duplicate cell current ($I'_{cell}$) larger than the predetermined reference current ($I_{ref3}$) or negative for the duplicate cell current ($I'_{cell}$) smaller than the predetermined reference current ($I_{ref3}$), therefrom, and an output end 275 for outputting a third logic signal ($O_3$) corresponding to magnitude of the difference current ($I_{d3}$) received thereby. In this embodiment, referring to FIGS. 2 and 4, the current comparator 25 (26, 27) includes a low-impedance source follower input stage 251 (261, 271) having the input end 250 (260, 270) and an output port 254 (264, 274), and an amplifier unit 257 (267, 277) having an input port 256 (266, 276) coupled electrically to the input end 250 (260, 270), and the output end 255 (265, 275). The low-impedance source follower input stage 251 (261, 271) has a very small input impedance ($R_i$) approximately equal to 1/gm. The source follower input stage 251 (261, 271) has an NMOS transistor (Mn1) and a PMOS transistor (Mp2). Sources of the NMOS and PMOS transistors (Mn1, Mp2) are coupled electrically to the input end 250 (260, 270). Gates of the NMOS and PMOS transistors (Mn1, Mp2) are coupled electrically to the output port 254 (264, 274). The amplifier unit 257 (267, 277) includes a first amplifier stage 252 (262, 272) having the input port 256 (266, 276) and a first output 51 (61, 71), and a second amplifier stage 253 (263, 273) having a second input 52 (62, 72) coupled electrically to the first output 51 (61, 71) of the first amplifier stage 252 (262, 272), and the output end 255 (265, 275). The first amplifier stage 252 (262, 272) includes a CMOS composed of a PMOS transistor (Mp3) and anNMOS transistor (Mn4). The second amplifier stage 253 (263, 273) includes a PMOS transistor (Mp5) and an NMOS transistor (Mn6). It is noted that the first output 51 (61, 71) of the first amplifier stage 252 (262, 272) and the second input 52 (62, 72) of the second amplifier stage 253 (263, 273) are coupled electrically to the output port 254 (264, 274) of the source follower input stage 251 (261, 271) so as to form a positive feedback path. Therefore, the amplifier units 257, 267, 277 can operate such that the NMOS transistors (Mn6) and PMOS transistors (Mp5) of the second amplifier stages 253, 263, 273 can be disposed speedily in the cut-off or saturation state so that the first, second and third logic signals ($O_1$, $O_2$, $O_3$) are equal to OV or Vcc at the output ends 255, 265, 275, respectively. Each of the current comparators 25, 26, 27 further includes an NMOS transistor (Mn3) coupled electrically to a source of the NMOS transistor (Mn4) of a corresponding one of the first amplifier stages 252, 262, 272 and controlled by a pulse signal (CK). When the pulse signal (CK) is at a logic low state, no current flows through the first amplifier stage 252, 262, 272 so as to reduce power consumption.

The encoder 28 is coupled electrically to the output ends 255, 265, 275 of the current comparators 25, 26, 27 for receiving the first, second and third logic signals ($O_1$, $O_2$, $O_3$) therefrom. The encoder 28 encodes the first, second and third logic signals ($O_1$, $O_2$, $O_3$), and outputs first and second encoded signals ($a_0$, $a_1$) according to the truth table of FIG. 3 so as to identify the level associated with the cell current ($I_{cell}$) flowing through the selected flash cell 20.

Due to the presence of the positive feedback path in each of the current comparators 25, 26, 27, when the difference currents ($I_{d1}$, $I_{d2}$, $I_{d3}$) received by the current comparators 25, 26, 27 become larger, the current comparators 25, 26, 27 can have a faster reaction speed. Referring to FIGS. 5a to 5f, when different magnitudes of the cell voltage ($v_{cell}$) equal to 1.0 V, 1.2 V, 1.4 V and 1.6 V are provided as shown in FIG. 5a, and the reference voltages ($V_{ref1}$, $V_{ref2}$, $V_{ref3}$) are 1.1 V, 1.3 V and 1.5 V, respectively, the first, second and third logic signals ($O_1$, $O_2$, $O_3$) vary as shown in FIGS. 5b to 5d and the first and second encoded signals ($a_0$, $a_1$) vary as shown in FIGS. 5e and 5f. It is noted that the current comparators 25, 26, 27 have a relatively short delay time ($T_d$) equal to about 3.5 ns as compared to that in prior art, thereby resulting in a faster data-sensing speed. Furthermore, each of the current comparators 25, 26, 27 has a simpler construction than the aforesaid prior art, thereby resulting in a relatively small size and in relatively low fabrication costs. The object of the invention is thus met.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A current-mode identifying circuit for a multilevel flash memory having a flash cell array that includes a plurality of flash cells, said identifying circuit being adapted to identify a level associated with a cell current flowing through a selected one of the flash cells, and comprising:

a current duplicating circuit having an input adapted to be coupled electrically to the selected one of the flash cells, and a plurality of outputs, said current duplicating circuit duplicating the cell current flowing through the selected one of the flash cells, and outputting a duplicate cell current at each of said outputs;

a plurality of nodes, each of which is coupled electrically to a corresponding one of said outputs of said current duplicating circuit so as to receive the duplicate cell current therefrom;

a plurality of reference current generating units, each of which is coupled electrically to a corresponding one of said nodes and draws a predetermined reference current from the corresponding one of said nodes such that a difference current between the duplicate cell current and the predetermined reference current flows out from the corresponding one of said nodes;

a plurality of current comparators, each of which has an input end coupled electrically to a corresponding one of said nodes for receiving the difference current therefrom, and an output end for outputting a logic signal corresponding to magnitude of the difference current received thereby; and an encoder coupled electrically to said output ends of said current comparators for receiving the logic signals therefrom, said encoder encoding the logic signals so as to identify the level associated with the cell current flowing through the selected one of the flash cells.

2. The identifying circuit as claimed in claim 1, wherein said current duplicating circuit includes a PMOS current mirror having said input and said outputs.

3. The identifying circuit as claimed in claim 1, wherein each of said reference current generating units includes a reference memory cell coupled electrically to a corresponding one of said nodes.

4. The identifying circuit as claimed in claim 3, wherein each of said reference memory cells is controlled by a reference voltage.

5. The identifying circuit as claimed in claim 4, wherein each of said reference memory cells has a pre-charged floating gate to control the amount of the predetermined reference current drawn thereby.

6. The identifying circuit as claimed in claim 3, wherein each of said reference memory cells is controlled by a specific reference voltage so as to control the amount of the predetermined reference current drawn thereby.

7. The identifying circuit as claimed in claim 1, further comprising a voltage-regulating circuit adapted to be coupled electrically to the selected one of the flash cells and coupled electrically to said input of said current duplicating circuit.

8. The identifying circuit as claimed in claim 7, wherein said voltage-regulating circuit includes an NMOS transistor having a drain coupled electrically to said input of said current duplicating circuit, a gate, and a source adapted to be coupled electrically to the selected one of said flash cells, said voltage-regulating circuit further including an inverter having an input port coupled electrically to said source of said NMOS transistor, and an output port coupled electrically to said gate of said NMOS transistor.

9. The identifying circuit as claimed in claim 3, wherein each of said reference current generating units further includes a voltage-regulating circuit interconnecting said reference memory cell and the corresponding one of said nodes.

10. The identifying circuit as claimed in claim 9, wherein said voltage-regulating circuit includes an NMOS transistor having a drain coupled electrically to the corresponding one of said nodes, a gate, and a source coupled electrically to said reference memory cell, said voltage-regulating circuit further including an inverter having an input port coupled electrically to said source of said NMOS transistor, and an output port coupled electrically to said gate of said NMOS transistor.

11. The identifying circuit as claimed in claim 1, wherein each of said current comparators includes a low-impedance source follower input stage having said input end and an output port, and an amplifier unit having an input port coupled electrically to said input end, and said output end.

12. The identifying circuit as claimed in claim 11, wherein said amplifier unit includes a first amplifier stage having said input port, and a first output, and a second amplifier stage having a second input coupled electrically to said first output of said first amplifier stage, and said output end.

13. The identifying circuit as claimed in claim 12, wherein said first output of said first amplifier stage and said second input of said second amplifier stage are coupled electrically to said output port of said source follower input stage so as to form a positive feedback path.

14. The identifying circuit as claimed in claim 12, wherein each of said current comparators further includes an NMOS transistor coupled electrically to said first amplifier stage of said amplifier unit and controlled by a pulse signal.

* * * * *